United States Patent [19]

Shibata et al.

[11] Patent Number: 4,563,240
[45] Date of Patent: Jan. 7, 1986

[54] METHOD AND APPARATUS FOR PLASMA PROCESS

[75] Inventors: Fumio Shibata; Katsuaki Nagatomo; Hidetomo Fukuhara; Gen Marumoto, all of Kudamatsu; Sadayuki Okudaira, Oume, all of Japan

[73] Assignee: Hitachi, Ltd., Tokyo, Japan

[21] Appl. No.: 636,997

[22] Filed: Aug. 2, 1984

[30] Foreign Application Priority Data

Aug. 10, 1983 [JP] Japan .................................. 58-144941

[51] Int. Cl.⁴ ........................ B44C 1/22; C03C 15/00; C03C 25/06; C23F 1/02
[52] U.S. Cl. .................................... 156/643; 156/345; 156/646; 204/192 E; 204/298
[58] Field of Search ....................... 156/643, 646, 345; 204/164, 192 EC, 192 E, 298; 427/38, 39; 134/1; 118/50.1, 620, 728, 729

[56] References Cited

U.S. PATENT DOCUMENTS

4,316,791 2/1982 Taillet .................................. 156/643

Primary Examiner—William A. Powell
Attorney, Agent, or Firm—Antonelli, Terry & Wands

[57] ABSTRACT

The invention relates to a method and apparatus for a plasma process in which identical samples are processed in a plasma-processing apparatus provided with a radio-frequency plasma generation means and a microwave plasma generation means, by the utilization of a radio-frequency plasma in the radio-frequency plasma generation means and a microwave plasma in the microwave plasma generation means. The plasma-processing rate can thus be increased, and also electrical damage due to ions in the plasma can be reduced, thereby ensuring a high throughput and a high quality during the manufacture of semiconductor integrated circuit elements.

12 Claims, 4 Drawing Figures

METHOD AND APPARATUS FOR PLASMA PROCESS

BACKGROUND OF THE INVENTION

1. Field of the Invention

The present invention relates to a method and apparatus for a plasma process, and is particularly concerned with a method and apparatus for a plasma process which enables a high throughput and good quality control during the manufacture of semiconductor integrated circuit elements.

2. Description of the Prior Art

Miniaturization and increased packing density of semiconductor integrated circuit elements have progressed rapidly in recent years, so that it has become necessary to increase the efficiency of the processes of manufacturing these semiconductor integrated circuit elements, and also improve the throughput and quality control thereof. To cope with all these requirements imposed on current processes of manufacturing semiconductor integrated circuit elements, plasma process techniques have been developed, and are proposed in, for example, Japanese Patent Laid-Open No. 95,630/1982 (1982-6), Japanese Patent Laid-Open No. 128,928/1982 (1982-10), and Japanese Patent Publication No. 34,461/1978 (1978-9).

For example, the plasma-processing technique disclosed in Japanese Patent Laid-Open No. 95,630/1982 concerns the processing of samples one-by-one in a plasma, using a plasma processor provided with a radio-frequency plasma generation means which is a single plasma generation means.

This kind of plasma-processing technique obtained by a radio-frequency plasma from a radio-frequency plasma generation means provides a large self-bias, so that the plasma-processing rate is high and consequently the throughput is high, but heavy electrical damage due to ions in the radio-frequency plasma is unavoidable, and thus there is the problem that it is difficult to keep quality as high as possible.

For example, the plasma-processing technique disclosed in Japanese Patent Laid-Open No. 128,928/1982 uses a plasma processor provided with a reactive plasma-etching means acting in a plasma conveyor system, and a reactive spatter-etching means acting in a parallel-plate system. This process comprises pre-processing a sample (for example, dehydrating or descumming the sample surface) using the reactive plasma-etching means in the plasma conveyor system, subjecting the pre-processed sample to predetermined etching by the reactive spatter-etching means in the parallel-plate system using a radio-frequency plasma, and then post-processing (for example, stripping the sample by the reactive plasma-etching means in the plasma conveyor system which was used for the pre-processing.

However, in this plasma-processing technique, the sample is subjected to a plasma process by only a radio-frequency plasma, so that although the throughput is increased in the same way as in the above conventional technique, a problem still remains concerning the maintaining of a satisfactorily high quality.

Another plasma-processing technique described in Japanese Patent Publication No. 34,461/1978 concerns the processing of samples in a plasma by a plasma processor provided with a microwave plasma generation means which is a single plasma generation means.

This technique of plasma-processing samples in a microwave plasma generating means using a microwave plasma provides only a small self-bias, so that electrical damage due to ions in the microwave plasma is small, and thus quality can be maintained at a high level. However, the plasma-processing rate is low, so that this technique has the problem that the throughput cannot be increased.

SUMMARY OF THE INVENTION

An object of the present invention is to provide a method and apparatus for a plasma process in which the plasma-processing rate is increased and electrical damage due to ions in the plasma is reduced, so that a high throughput and high quality is enabled.

The present invention features a plasma process wherein samples are processed with a radio-frequency plasma and the samples so processed are then processed with a microwave plasma to a final stage by means of a plasma processing apparatus, which provides a radio-frequency plasma generation means for generating said radio-frequency plasma and for processing the samples with the radio-frequency plasma as well as a microwave plasma generation means for generating the microwave plasma and for processing the samples with the microwave plasma.

The samples are processed by a plasma with an increased self-bias as far as an intermediate step, and with a reduced self-bias as far as the final step, so that the plasma-processing rate is increased and electrical damage due to ions in the plasma is reduced.

DESCRIPTION OF THE PREFERRED EMBODIMENTS

During a process of manufacturing semiconductor integrated circuit elements, samples are etched and films are formed using a plasma. Embodiments of the present invention will be described below with reference to the etching of these samples.

Figure 1:
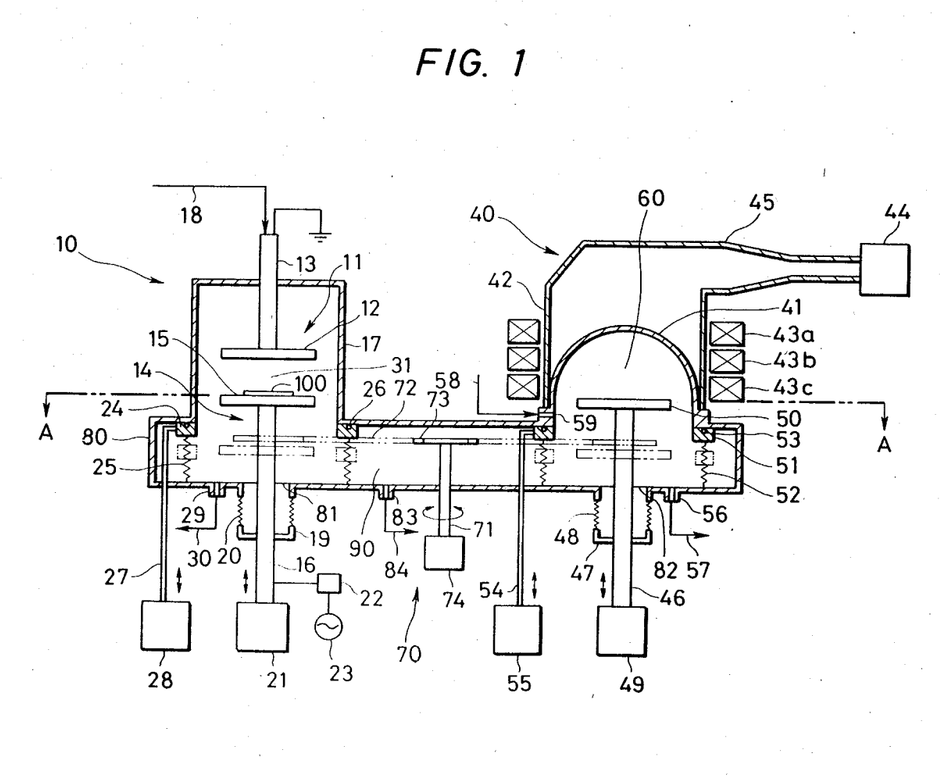
FIG. 1 is a longitudinal section through a sample plasma processor, illustrating a first embodiment of the plasma processor according to the present invention.

A first embodiment of the invention is shown in FIG. 1.

Figure 2:
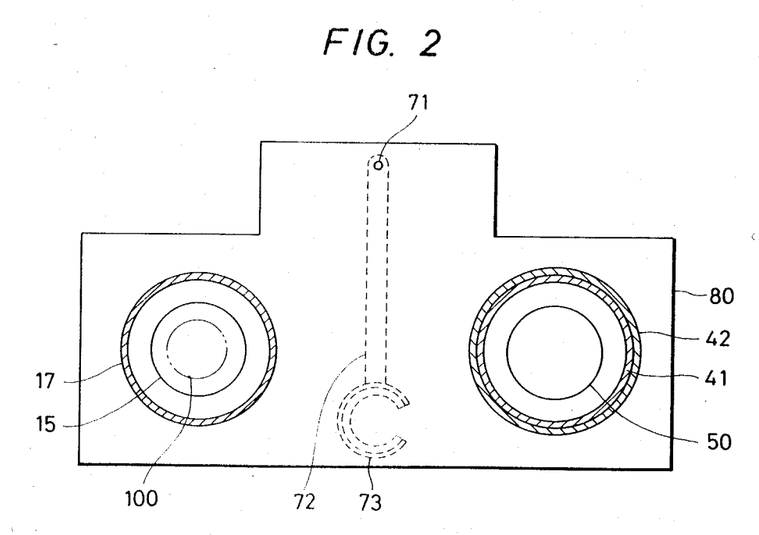
FIG. 2 is a section taken along the line A—A of the sample plasma processor of FIG. 1.

In FIG. 1 and FIG. 2, the plasma processor is, for example, a sample plasma processor in which wafers are etched one-by-one by plasma. In this case, it comprises a radio-frequency plasma generation means 10 which generates a radio-frequency plasma which is used to etch samples therein, a microwave plasma generation means 40 which generates a microwave plasma which is used to etch samples therein, and a conveyor means 70 which conveys the samples between the radio-frequency plasma generation means 10 and the microwave plasma generation means 40. In this example, the microwave plasma generation means 40 is provided on the post-process side of the radio-frequency plasma generation means 10.

In FIG. 1 and FIG. 2, an opposite electrode 11 consists of an electrode plate 12 and an electrode shaft 13, and, in this case, an electrode (called a "table" hereinafter) 14 on which a single sample is placed or arranged consists of an electrode plate 15 and an electrode shaft 16. The area of the electrode plate 15 on which the sample is placed or arranged is larger than that of the sample. A gas dispersion part (not shown) is formed in the electrode plate 12, and a large number of discharge holes are provided (not shown) opening from one side (lower side in FIG. 1) of the electrode plate 12 and communicating with the gas dispersion part. A gas passage (not shown) communicating with the gas dispersion part in the electrode plate 12 is formed axially within the electrode shaft 13. A vacuum vessel 17 communicating with a buffer chamber 80 is connected airtightly to the buffer chamger 80 by an opening in the top wall thereof. The electrode shaft 13 is arranged so that one end thereof (the upper end in FIG. 1) projects out of the vacuum vessel 17 at approximately the center of the top wall thereof. The electrode plate 12 is arranged approximately horizontally at the other end (the lower end within the vacuum vessel 17 of FIG. 1) of the electrode shaft 13, approximately centered on the center of the electrode shaft 13, and with the side thereof provided with gas discharge holes downward. In this way, the gas dispersion part of the electrode plate 12 and the gas passage of the electrode shaft 13 are in communication with each other. A gas supply pipe 18 connected to an etching gas source (not shown) by a gas flow controller (not shown) is connected to the electrode shaft 13 by the gas passage. The electrode shaft 13 is grounded. The buffer chamber 80 and the vacuum vessel 17 are kept airtight, and the electrode shaft 16 is provided virtually coaxially with the electrode shaft 13, so that it can move up and down through the base wall of the buffer chamber 80 opposite to the top wall of the vacuum vessel 17. One end (the upper end in FIG. 1) of the electrode shaft 16 is inserted through an opening 81 in the base wall of the buffer chamber 80 airtight bellows 20 is provided between a flange 19 provided partway along the electrode shaft 16 and the base wall of the buffer chamber 80 around the electrode shaft 16, and the other end thereof (the lower end, outside the buffer chamber 80 in FIG. 1) is connected to a reciprocator 21. The electrode plate 15 is arranged approximately horizontally on one end (the upper end in FIG. 1) of the electrode shaft 16, approximately centered on the center of the electrode shaft 16 and with the surface on which the wafer is placed or arranged vertically opposite to the surface of the electrode plate 12 in which the gas discharge holes are provided. A radio-frequency power source 23 is connected to a lower end portion of the electrode shaft 16 by a matching box 22, and the radio-frequency power source 23 is grounded. The electrode plate 15 and the electrode shaft 16 are insulated electrically from the buffer chamber 80 and the vacuum vessel 17. The opening in the top wall of the buffer chamber 80 corresponding to the vacuum vessel 17 is large enough to allow the electrode plate 15 to pass therethrough, and a flange 24 provided with an opening virtually equal in size to that of that opening is arranged that the opening in the top wall of the buffer chamber 80 and the opening in the flange 24 roughly coincide, and the flange 24 can come into contact with the top wall of the buffer chamber 80. Airtight bellows 25 bridges the space between the flange 24 and the base wall of the buffer chamber 80 opposite to the flange 24, around the electrode plate 15 and the electrode shaft 16. A seal ring 26 is installed in the surface of the flange 24 facing the top wall of the buffer chamber 80. A vertically-movable rod 27 passing through the base wall of the buffer chamber 80, while keeping the airtightness thereof, is provided in, in this case, a side wall of the flange 24, and the end of the rod 27 outside the buffer chamber 80 is connected to a reciprocator 28. An exhaust nozzle 29 communicating with the interior of the bellows 25 in the buffer chamber 80 is provided in the base wall of the buffer chamber 80, and an exhaust pipe 30 connected to a vacuum exhauster (not shown) by a device such as a variable conductance means (not shown) is connected to the exhaust nozzle 29.

In FIG. 1 and FIG. 2, a discharge tube 41 communicating with the buffer chamber 80 through a second opening in the top thereof is provided airtightly in the buffer chamber 80. The discharge tube 41 is formed of an insulating material such as quartz or alumina. A waveguide 42 including the discharge tube 41 is provided concentrically around the outside of the discharge tube 41. The waveguide 42 is formed of a conductive material. Independently-operating solenoid coils 43a to 43c are provided annularly along the length, in this case vertically, of the waveguide 42. The waveguide 42 and a microwave generator 44 are connected together by a microwave propagation means 45 such as a waveguide or a coaxial cable. The axis of a vertically-movable reciprocating shaft 46 is centered approximately on that of the discharge tube 41, and is arranged so that it maintains the airtightness of the buffer chamber 80 and the discharge tube 41 as it passes through the base wall of the buffer chamber 80, opposite to the discharge tube 41. One end (the upper end in FIG. 1) of the reciprocating shaft 46 is inserted through another opening 82 in the base wall of the buffer chamber 80, airtight bellows 48 bridges the gap between a flange 47 provided partway along the reciprocating shaft 46 and the base wall of the buffer chamber 80, around the reciprocating shaft 46, and the other end of the reciprocating shaft 46 (the lower end, outside the buffer chamber 80 in FIG. 1) is connected to a reciprocator 49. A sample stand 50 is provided approximately horizontally at one end of the reciprocating shaft 46 (the upper end in FIG. 1), virtually centered on the center of the reciprocating shaft 46, and with the surface on which the sample is placed or arranged facing the top of the discharge tube 41. The second opening in the top wall of the buffer chamber 80 which corresponds to the discharge tube 41 is large enough to allow the sample stand 50 to pass therethrough, and a flange 51 provided with an opening approximately equal in size to that of that opening is positioned so that the opening in the top wall of the buffer chamber 80 and the opening in the flange 51 roughly coincide with each other, and the flange 51 can come into contact with the top wall of the buffer chamber 80. Airtight bellows 52 bridges the space between the flange 51 and the base wall of the buffer chamber 80 opposite to the flange 51, around the reciprocating shaft 46 and the sample stand 50. An annular seal ring 53 is provided in the surface of the flange 51 facing the top wall of the buffer chamber 80. A vertically-movable rod 54 passed through the base wall of the buffer chamber 80 so as to keep the airtightness thereof is provided in a side wall of, in this case, the flange 51, and the end of the rod 54 outsidee the buffer chamber 80 is connected to a reciprocator 55. An exhaust nozzle 56 communicating with the interior of the bellows 52 in the buffer chamber 80 is provided in the base wall of the buffer chamber 80, and an exhaust pipe 57 connected to a vacuum exhauster (not shown) is attached to the exhaust nozzle 56. A gas supply pipe 58 connected to a discharge gas source (not shown) by a gas-flow controller (not shown) communicates with the discharge tube 41 through a gas supply hole 59.

The conveyor means 70 consists for example, of a rotary shaft 71, an arm 72, a sample scoop 73 and a rotary device 74. The rotary shaft 71 is arranged so that one end thereof (the upper end in FIG. 1) projects into the buffer chamber 80 through the base wall of the buffer chamber 80, with the axis thereof perpendicular to the approximate center of a straight line connecting the axes of the electrode shaft 16 and the reciprocating shaft 46. One end of the arm 72 is attached to the upper end of the rotary shaft 71, and the sample scoop 73 is provided at the other end of the arm 72 at a position such that it can transfer a sample between the electrode plate 15 of the radio-frequency plasma generation means 10 and the sample stand 50 of the microwave plasma generation means 40. The end of the rotary shaft 71 outside the buffer chamber 80 is connected to the rotary device 74. An exhaust nozzle 83 communicating with the exteriors of the bellows 25, 52 in the buffer chamber 80 is provided in the base wall of the buffer chamber 80, and an exhaust pipe 84 connected to a vacuum exhauster (not shown) is connected to the exhaust nozzle 83.

In FIG. 1 and FIG. 2, a radio-frequency plasma process chamber 31 of the radio-frequency plasma generation means 10 is formed of the space within the buffer chamber 80 separated by the flange 24 and the bellows 25, and the space within the vacuum vessel 17. A microwave plasma process chamber 60 of the microwave plasma generation means 40 is formed of the space within the buffer chamber 80 separated by the flange 51 and the bellows 52, and the space within the discharge tube 41. The space within the buffer chamber 80 separated between the flange 24 and the bellows 25 at one end and the flange 51 and the bellows 52 at the other acts as an auxiliary vacuum chamber 90. In this embodiment, the microwave plasma generation means 40 is provided on the post-process side of the radio-frequency plasma generation means 10 through the auxiliary vacuum chamber 90, and the conveyor means 70 is arranged so that it transfers a sample from the radio-frequency plasma generation means 10 to the microwave plasma generation means 40 through the auxiliary vacuum chamber 90.

In FIG. 1 and FIG. 2, the reciprocator 28 is actuated to bring the flange 24 into contact with the top wall of the buffer chamber 80, and the reciprocator 55 is actuated to bring the flange 51 into contact with the top wall of the buffer chamber 80, to keep the radio-frequency plasma process chamber 31, the auxiliary vacuum chamber 90 and the microwave plasma process chamber 60 isolated and independent of each other. When each vacuum exhauster is actuated in this state, the radio-frequency plasma process chamber 31 and the microwave plasma process chamber 60 are decompressed to predetermined pressures. A single sample 100 is transferred into the auxiliary vacuum chamber 90 from outside on a known conveyor means (not shown), and is picked up by the sample scoop 73, with the surface thereof which is to be etched upward. The auxiliary vacuum chamber 90 is then decompressed to a predetermined pressure by the vacuum exhauster. The electrode plate 15 is then lowered by the reciprocator 21 to a position (indicated by broken lines in FIG. 1) at which the sample scoop 73 is ready to transfer the sample 100. The reciprocator 28 is actuated when the exhausting of the auxiliary vacuum chamber 90 is completed, to lower the flange 24 to a position (indicated by broken lines in FIG. 1) at which the sample scoop 73 and the arm 72 are able to rotate. This also brings the radio-frequency plasma process chamber 31 and the auxiliary vacuum chamber 90 into communication with each other. The rotary device 74 is then actuated to rotate the sample scoop 73 as far as a position corresponding to the electrode plate 15, so that the sample 100 is carried into the radio-frequency plasma process chamber 31 from the auxiliary vacuum chamber 90. The sample 100 on the sample scoop 73 is transferred to the electrode plate 15 and is placed or arranged thereon with the surface which will be etched upward. The sample scoop 73 which had transferred the sample 100 to the electrode plate 15 is returned to the auxiliary vacuum chamber 90 by the actuation of the rotary device 74, and then stands by at, for example, the position shown in FIG. 1. The radio-frequency plasma process chamber 31 is again isolated from the auxiliary vacuum chamber 90 by the actuation of the reciprocator 28. The reciprocator 21 is actuated to raise the electrode plate 15 on which the sample 100 has been placed or arranged, within the radio-frequency plasma process chamber 31, and stop it at a position at which the space between the electrode palte 12 and the electrode plate 15 is a predetermined electrode distance. The supply of a predetermiend quantity of etching gas into the gas passage of the electrode shaft 13 is started from the etching gas source, through the gas supply pipe 18. In this case, the supply of etching gas is controlled at a predetermined rate by a gas-flow controller. After passing through the gas passage, the etching gas supplied through the electrode shaft 13 flows into the gas dispersion part of the electrode plate 12, is dispersed evenly through the gas dispersion part, and is discharged toward the surface of the sample 100 being etched, from the gas discharge holes. The etching gas discharged in the way from the gas discharge holes in the electrode plate 12 flows radially over the surface of the sample 100 being etched, and is then exhausted from the radiofrequency plasma process chamber 31 through the exhaust nozzle 29 and the exhaust pipe 30 by the operation of the vacuum exhauster. In this case, the volume of etching gas exhausted is controlled by the variable conductance means so that it is less than the volume of etching gas discharged from the gas discharge holes of the electrode plate 12, and the radio-frequency plasma process chamber 31 is controlled thereby to remain at a predetermined etching pressure. When power of a predetermined radio-frequency is applied in this state to the electrode plate 15 from the radio-frequency power source 23 through the matching box 22 and the electrode shaft 16, a glow discharge is generated between the electrode plates 12 and 15, and the etching gas forms a plasma. The sample 100 is etched at a predetermined rate as far as an intermediate step by the radio-frequency plasma. When this etching is completed, the application of radio-frequency power to the electrode plate 15 is stopped, and the discharge of the etching gas from the gas discharge holes of the electrode plate 12 is also stopped. The reciprocator 21 is then actuated to lower the electrode plate 15 on which the sample 100 is placed or arranged to a position (indicated by broken lines in FIG. 1) at which the sample 100 can be transferred to the sample scoop 73. The reciprocator 28 is actuated to lower the flange 24 to a position (indicated by broken lines in FIG. 1) at which the sample scoop 73 and the arm 72 are able to rotate, and the radio-frequency plasma process chamber 31 and the auxiliary vacuum chamber 90 are again brought into communication with each other. By actuating the rotary device 74 in this state, the sample scoop 73 is rotated to a position corresponding to the electrode plate 15, and the sample 100 is transferred to the sample scoop 73 from the electrode plate 15. The sample scoop 73 which has received the sample 100 is returned to the standby position within the auxiliary vacuum chamber 90. The reciprocator 28 is then actuated to isolate the radio-frequency plasma process chamber 31 and the auxiliary vacuum chamber 90 again, and the reciprocator 49 is actuated to lower the sample stand 50 position (indicated by broken lines in FIG. 1) at which the sample 100 can be transferred from the sample scoop 73. The reciprocator 55 is actuated when the radio-frequency plasma process chamber 31 and the auxiliary vacuum chamber 90 are isolated and are independent from each other, to lower the flange 51 to a position (indicated by broken lines in FIG. 1) at which the sample scoop 73 and the arm 72 are able to rotate, and bring microwave plasma process chamber 60 and the auxiliary vacuum chamber 90 into communication with each other. In this case, the rotary device 74 is actuated, the sample scoop 73 is rotated to a position corresponding to the sample stand 50, so that the sample 100 is transferred into the microwave plasma process chamber 60 from the auxiliary vacuum chamber 90. The sample 100 on the sample scoop 73 is then transferred to the sample stand 50 from the sample scoop 73, and is placed or arranged on the sample stand 50 with the surface being etched upward. When it has transferred the sample 100 to the sample stand 50, the sample scoop 73 is returned to its standby position within auxiliary vacuum chamber 90. The reciprocator 55 is then actuated to isolate the auxiliary vacuum chamger 90 and the microwave plasma process chamber 60 again, and the reciprocator 49 is actuated to raise the sample stand 50 on which the sample 100 is placed or arranged, as far as a level at which it reaches a discharge region within the discharge tube 41 where it is stopped. A predetermined quantity of discharge gas is then supplied to the microwave plasma process chamber 60 from the discharge gas source through the gas supply pipe 58 and the gas supply holes 59, and the pressure within the microwave plasma process chamber 60 is controlled by the operation of the vacuum exhauster so that it is maintained at a microwave plasma process pressure. Microwaves generated by the microwave generator 44 are introduced into the waveguide 42 through the microwave propagation means 45, and are then absorbed by the discharge tube. 41. A magnetic field is generated by the passage of predetermined currents independently through the solenoid coils 43a to 43c. The electric field formed by the microwaves and the magnetic field formed by the solenoid coils 43a to 43c generates a plasma discharge within the discharge region of the discharge tube 41, and the discharge gas supplied to the microwave plasma process chamber 60 forms a plasma. The wafer 100 is etched as far as the final step by this microwave plasma. When this etching of the wafer 100 is completed, the generation of microwaves by the microwave generator 44 is stopped, and the supply of discharge gas to the microwave plasma process chamber 60 is also stopped. The reciprocator 49 is then actuated to lower the sample stand 50 on which the sample 100 is placed or arranged to a position (indicated by broken lines in FIG. 1) at which the sample 100 can be transferred to the sample scoop 73. The reciprocator 55 is then actuated to lower the flange 51 to a position (indicated by broken lines in FIG. 1) at which the sample scoop 73 and the arm 72 are able to rotate, bringing the auxiliary vacuum chamber 90 and the microwave plasma process chamber 60 again into communication with each other. The rotary device 74 is actuated in this state so that, the sample scoop 73 is rotated to the position corresponding to the sample stand 50, and the sample 100 is then transferred to the sample scoop 73 from the sample stand 50. After receiving the sample 100, the sample scoop 73 returns to its standby position in the auxiliary vacuum chamber 90. The reciprocator 55 is then actuated to isolate the auxiliary vacuum chamber 90 and the microwave plasma process chamber 60 again. The sample 100 which has been etched and thus returned to the auxiliary vacuum chamber 90 is transferred to a known conveyor means and is removed thereby from the auxiliary vacuum chamber 90.

By repeating these operations, identical samples can be subjected to plasma etching one-by-one by a radio-frequency plasma and a microwave plasma.

For example, polycrystalline silicon used for the gate films of semiconductor integrated circuit elements can be etched as follows. 70 to 80% of the polycrystalline silicon is etched at an etching rate of about 600 to 800 nm/min by a radio-frequency plasma under conditions in which the etching gas contains at least $SF_6$, the quantity of etching gas supplied is 100 sccm, the etching pressure is between 0.05 to 0.2 Torr, the radio-frequency power used therefor is 400W. The remaining 30 to 20% of the polycrystalline silicon is etched an etching rate of 100 to 200 nm/min by a microwave plasma under conditions in which the discharge gas contains at least $SF_6$, the quantity of discharge gas supplied is 10 sccm, the microwave plasma process pressure is between $5 \times 10^{-4}$ to $3 \times 10^{-2}$ Torr.

The following effects can be obtained by this embodiment. (1) By plasma-etching the samples with an increased self-bias as far as an intermediate step, but with a reduced self-bias subsequently as far as the final step, the plasma etching rate is increased and also the electrical damage due to ions in the plasma is reduced, so that a high throughput and high quality can be ensured. (2) Samples can be subjected to anisotropic etching by a radio-frequency plasma as far as an intermediate step, and then to isotropic etching by a microwave plasma until the final step, so that the cross-sectional shape of the pattern thereof can be controlled very easily. (3) When a multilayer film is etched by a plasma, the upper layers can be etched first by a radio-frequency plasma generation means, and then the lower layers can be etched by transferring the sample which has been subjected to this plasma etching from the radio-frequency plasma generation means to a microwave plasma generation means, so that the residue and reaction products of the etching gas used for the plasma-etching of the surface layer can be prevented from contaminating the subsequent etching, and the occurrence of pattern defects due to the deposition of the reaction products and corrosion due to the residual etching gas and the reaction products can also be prevented.

Figure 3:
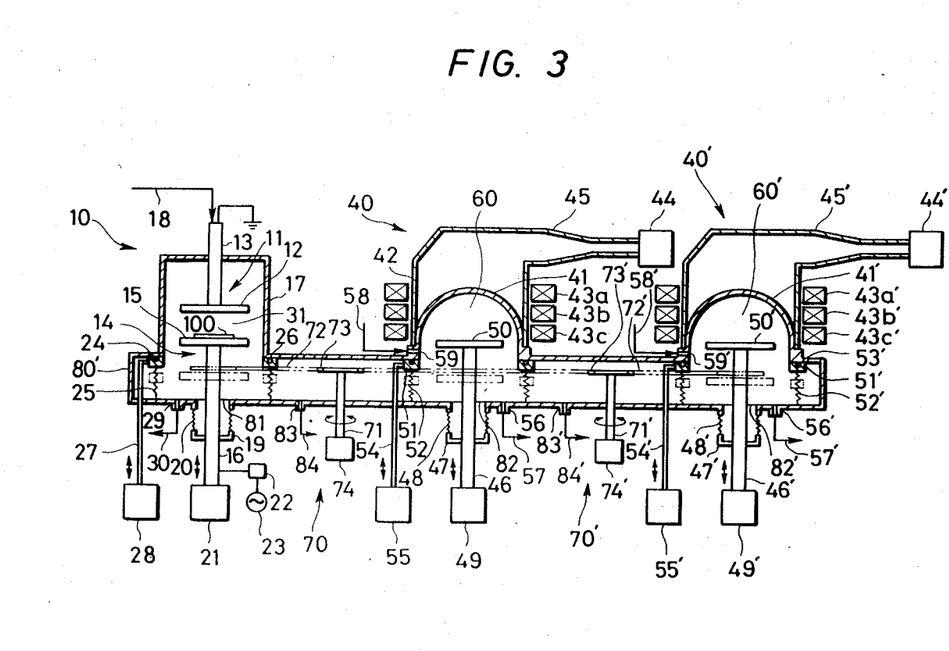
FIG. 3 is a longitudinal section through a sample plasma processor, illustrating a second embodiment of the plasma processor according to the present invention.

FIG. 3 shows a second embodiment of the present invention wherein two sets of microwave plasma generation means 40, 40' are provided on, in this case, the post-process side of the radio-frequency plasma generation means 10. The two microwave plasma generation means 40, 40' are provided in series with the radio-frequency plasma generation means 10.

In FIG. 3, a third opening is formed in the top wall of a buffer chamber 80' behind and in series with the second opening. A discharge tube 41' communicating with the buffer chamber 80' through the third opening is provided airtightly in the buffer chamber 80'. The discharge tube 41' is formed of an insulating material such as quartz or alumina. A waveguide 42' including the discharge tube 41' is provided concentrically around the outside of the discharge tube 41'. The waveguide 42' is formed of a conductive material. Independently-operating solenoid coils 43a' to 43c' are provided annularly along the length, in this case vertically, of the waveguide 42'. The waveguide 42' and a microwave generator 44' are connected together by a microwave propagation means 45' such as a waveguide or a coaxial cable. The axis of a vertically-movable reciprocating shaft 46' is centered approximately on that of the discharge tube 41', and is arranged so that it maintains the airtightness of the buffer chamber 80' and the discharge tube 41' as it passes through the base wall of the buffer chamber 80' opposite to the discharge tube 41'. One end of the reciprocating shaft 46'(the upper end in FIG. 3) is inserted through a third opening 82' in the base wall of the buffer chamber 80' airtight bellows 48' bridges the gap between a flange 47' provided partway along the reciprocating shaft 46' and the base wall of the buffer chamber 80', around the reciprocating shaft 46', and the other end of the reciprocating shaft 46'(the lower end, outside the buffer chamber 80' in FIG. 3) is connected to a reciprocator 49'. A wafer stand 50' is provided approximately horizontally at one end (the upper end in FIG. 3) of the reciprocating shaft 46', virtually centered on the center of the reciprocating shaft 46', and with the surface on which the sample is placed or arranged facing the top of the discharge tube 41'. The third opening corresponding to the discharge tube 41' in the top wall of the buffer chamber 80' is large enough to allow the sample stand 50' to pass therethrough, and a flange 51' provided with an opening approximately equal in size to that of that opening is positioned so that the opening in the flange 51' and the third opening in the top wall of the buffer chamber 80' roughly coincide with each other, and the flange 51' can come into contact with the top wall of the buffer chamber 80'. Airtight bellows 52' bridges the space between the flange 51' and the base wall of the buffer chamber 80' opposite to the flange 51', around the sample stand 50'. An annular seal ring 53' is provided in the surface of the flange 51' facing the top wall of the buffer chamber 80'. A vertically-movable rod 54' passed through the base wall of the buffer chamber 80' so as to maintain the airtightness thereof is provided in a side wall of, in this case, the flange 51', and the end of the rod 54' outside the buffer chamber 80' is connected to a reciprocator 55'. An exhaust nozzle 56' communicating with the interior of the bellows 52' in the buffer chamber 80' is provided in the base wall of the buffer chamber 80', and an exhaust pipe 57' connected to a vacuum exhauster (not shown) is connected to the exhaust nozzle 56'. A gas supply pipe 58' connected to a discharge gas source (not shown) by a gas-flow controller (not shown) communicates with the discharge tube 41' through a gas supply hole 59'.

In FIG. 3, a rotary shaft 71' is provided rotatably through the base wall of the buffer chamber 80' with one end (the upper end in FIG. 3) projecting into the buffer chamber 80' so as to maintain the airtightness thereof, with the axis thereof perpendicular to the approximate center of a straight line connecting the axes of the reciprocating shafts 46, 46'. One end of an arm 72' is attached to the upper end of the rotary shaft 71', and a sample scoop 73' is provided at the other end of the arm 72' at a position such that it can transfer a sample between the sample stands 50 and 50'. The end of the rotary shaft 71' outside the buffer chamber 80' is connected to a rotary device 74'. An exhaust nozzle 83' communicating with the exteriors of the bellows 52, 52' in the buffer chamber 80' is provided in the base wall of the buffer chamber 80', and an exhaust pipe 84' connected to a vacuum exhauster (not shown) is connected to the exhaust nozzle 83'.

In FIG. 3, in addition to the radio-frequency plasma process chamber 31 of the radio-frequency plasma generation means 10 and the microwave plasma process chamber 60 of the microwave plasma generation means 40 of FIG. 1, a microwave plasma process chamber 60' of the second microwave plasma generation means 40' is formed of the space within the buffer chamber 80' separated by the flange 51' and the bellows 52' and the space within the discharge tube 41'. In addition to the auxiliary vacuum chamber 90 of FIG. 1, the space within the buffer chamber 80' defined between the flange 51 and the bellows 52 at one end, and the flange 51' and the bellows 52' at the other, acts as a second auxiliary vacuum chamber 90'. In this embodiment, the microwave plasma generation means 40 is provided on the post-process side of the radio-frequency plasma generation means 10 through the auxiliary vacuum chamber 90, and the second microwave plasma generation means 40' is provided in series on the post-process side of the microwave plasma generation means 40 through the second auxiliary vacuum chamber 90'. The conveyor means 70 is arranged so that it transfers a sample from the radio-frequency plasma generation means 10 to the microwave plasma generation means 40 through the auxiliary vacuum chamber 90, and the other conveyor means 70' is arranged so that it transfers the sample from the microwave plasma generation means 40 to the second microwave plasma generation means 40' through the second auxiliary vacuum chamber 90'. The conveyor means 70' consists of the rotary shaft 71', the arm 72', the sample scoop 73' and the rotary device 74'. In FIG. 3, like reference characters denote parts identical to those in FIG. 1 and FIG. 2, and so no further description is given thereof.

In FIG. 3, in the same way as in the first embodiment, the sample 100 is plasma-etched as far as an intermediate step in the radio-frequency plasma generation means 10 by a radio-frequency plasma, and then this sample 100 which has been plasma-etched is processed in the microwave plasma generation means 40 to a step halfway, for example, between that intermediate step to the final step, by a microwave plasma. The sample 100 which has thus been plasma-etched is then processed as far as the final step in the second microwave plasma generation means 40' by a microwave plasma. The plasma-etching of the sample 100 by the microwave plasma generation means 40' is similar to that of the microwave plasma generation means 40 of the first embodiment. In this case, during the time that the sample 100 is being plasma-etched by the microwave plasma generation means 40, for example, another sample can be transferred into the radio-frequency plasma generation means 10 where it is plasma-etched as far as the intermediate step. Similarly, while the sample 100 is being plasma-etched by the second microwave plasma generation means 40', for example, the other sample which has been plasma-etched by the radio-frequency plasma generation means 10 as far as the intermediate step can be etched by the microwave plasma generation means 40; and while the second sample is being plasma-etched by the microwave plasma generation means 40, a third sample can be trnasferred into the radio-frequency plasma generation means 10 where it is plasma-etched as far as the intermediate step.

By repeating these operations, samples etched as far as the intermediate step by a radio-frequency plasma can be subsequently plasma-etched in series up to the final step by two microwave plasmas.

In addition to the effects obtained by the first embodiment, as described above, the following effect can be obtained by the present embodiment. (1) Since the plasma-etching rate can be increased further, the throughput can be increased accordingly.

Figure 4:
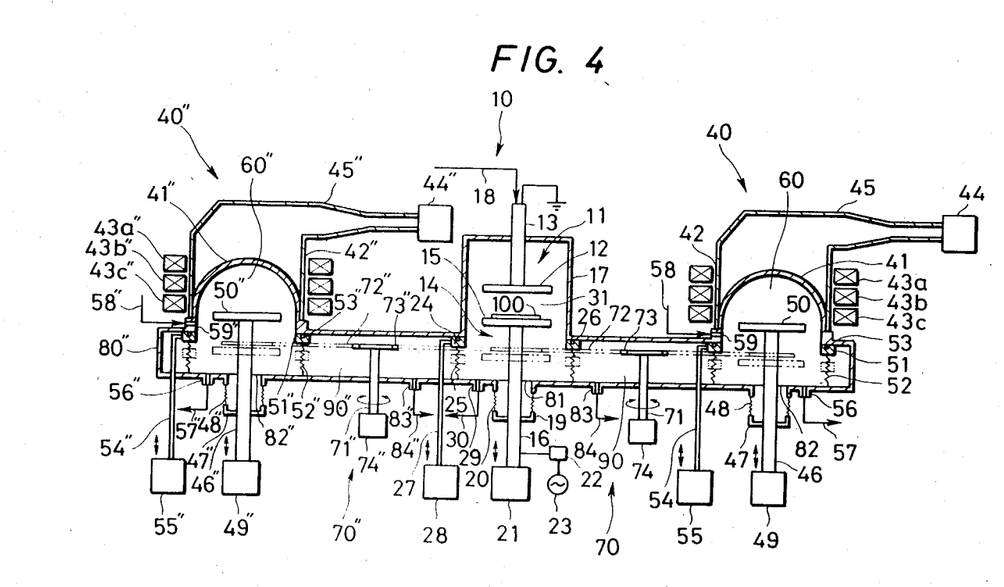
FIG. 4 is a longitudinal section through a sample plasma processor, illustrating a third embodiment of the plasma processor according to the present invention.

FIG. 4 shows a third embodiment of the present invention wherein two sets of microwave plasma generation means 40, 40" are provided on the post-process side of the radio-frequency plasma generation means 10. The microwave plasma generation means 40, 40" are provided in parallel in this case.

In FIG. 4, a third opening is formed in the top wall of a buffer chamber 80" at a position symmetrical with the second opening across from the first opening. A discharge tube 41" communicating with the buffer chamber 80" through the third opening is provided airtightly in the buffer chamber 80". The discharge tube 41" is formed of an insulating material such as quartz or alumina. A waveguide 42" including the discharge tube 41" is provided concentrically around the outside of the discharge tube 41". The waveguide 42" is formed of a conductive material. Independently-operating solenoid coils 43a" to 43c" are provided annularly along the length, in this case vertically, of the waveguide 42". The waveguide 42" and a microwave generator 44" are connected together by a microwave propagation means 45" such as a waveguide or a coaxial cable. The axis of a vertically-movable reciprocating shaft 46" is centered approximately on that of the discharge tube 41", and passes through the base wall of the buffer chamber 80". One end (the upper end in FIG. 4) of the reciprocating shaft 46" is inserted through an opening 82" in the base wall of the buffer chamber 80", airtight bellows 48" bridges the space between a flange 47" provided partway along the reciprocating shaft 46" and the base wall of the buffer chamber 80", around the reciprocating shaft 46", and the other end of the reciprocating shaft 46"(the lower end, outside the buffer chamber 80" in FIG. 4) is connected to a reciprocator 49". A sample stand 50" is provided approximately horizontally at one end of the reciprocating shaft 46"(the upper end in FIG. 4), virtually centered thereon, and with the surface on which the sample is placed or arranged facing the top of the discharge tube 41". The third opening in the top wall of the buffer chamber 80" which corresponds to the discharge tube 41" is large enough to allow the sample stand 50" to pass therethrough, and a flange 51" provided with an opening approximately equal in size to that of that opening is positioned so that the third opening in the top wall of the buffer chamber 80" and the opening in the flange 51" roughly coincide with each other, and the flange 51" can come into contact with the top wall of the buffer chamber 80". Airtight bellows 52" bridges the space between the flange 51" and the base wall of the buffer chamber 80" opposite to the flange 51", around the reciprocating shaft 46" and the sample stand 50. An annular seal ring 53" is provided in the surface of the flange 51" facing the top wall of the buffer chamber 80". A vertically-movable rod 54" passed through the base wall of the buffer chamber 80" so as to keep the airtightness thereof is provided in a side wall of, in this case, the flange 51", and the end of the rod 54" outside the buffer chamber 80" is connected to a reciprocator 55". An exhaust nozzle 56" communicating with the interior of the bellows 52" in the buffer chamber 80" is provided in the base wall of the buffer chamber 80", and an exhaust pipe 57" connected to a vacuum exhauster (not shown) is attached to the exhaust nozzle 56". A gas supply pipe 58" connected to a discharge gas source (not shown) by a gas-flow controller (not shown) communicates with the discharge tube 41" through a gas supply hole 59".

A rotary shaft 71" is provided rotatably through the base wall of the buffer chamber 80" with one end (the upper end portion in FIG. 4) projecting into the buffer chamber 80" with the axis thereof perpendicular to the approximate center of a straight line connecting the axes of the electrode shaft 16 and the reciprocating shaft 46". One end of the arm 72" is attached to the upper end of the rotary shaft 71", and a sample scoop 73" is provided at the other end of the arm 72" at a position such that it can transfer a sample between the electrode plate 15 of the radio-frequency plasma generation means 10 and the sample stand 50" of the second microwave plasma generation means 40". The end of the rotary shaft 71" outside the buffer chamber 80" is connected to a rotary device 74". An exhaust nozzle 83" communicating with the exteriors of the bellows 25, 52" in the buffer chamber 80" is provided in the base wall of the buffer chamber 80", and an exhaust pipe 84" connected to a vacuum exhauster (not shown) is connected to the exhaust nozzle 83".

In FIG. 4, in addition to the radio-frequency plasma process chamber 31 of the radio-frequency plasma generation means 10 and the microwave plasma process chamber 60 of the microwave plasma generation means 40 of FIG. 1, a microwave plasma process chamber 60" of the second microwave plasma generation means 40" is formed of the space within the buffer chamber 80" separated by the flange 51" and the bellows 52" and the space within the discharge tube 43". In addition to the auxiliary vacuum chamber 90 of FIG. 1, the space within the buffer chamber 80" defined between the flange 24 and the bellows 25 at one end, and the flange 51" and the bellows at the other, act as a second auxiliary vacuum chamber 90". In this embodiment, the microwave plasma generation means 40 is provided on the post-process side of the radio-frequency plasma generation means 10 through the auxiliary vacuum chamber 90, and the second microwave plasma generation means 40" is also provided on the post-process side of the radio-frequency plasma generation means 10 but through the second auxiliary vacuum chamber 90". In other words, the microwave plasma generation means 40 and the second microwave plasma generation means 40" are arranged parallel with respect to the radio-frequency plasma generation means 10. The conveyor means 70 is arranged so that it transfers a sample from the radio-frequency plasma generation means 10 to the microwave plasma generation means 40 through the auxiliary vacuum chamber 90, and the conveyor means 70'' is arranged so that it transfers the sample from the radio-frequency plasma generation means 10 to the second microwave plasma generation means 40'' through the second auxiliary vacuum chamber 90''. The conveyor means 70'' consists of the rotary shaft 71'', the arm 72'', the sample scoop 73'' and the rotary device 74''. In FIG. 4, like reference characters denote parts identical to those in FIG. 1, and FIG. 2, and so no further description is given thereof.

In FIG. 4, in the same way as in the first embodiment, the sample 100 is plasma-etched as far as an intermediate step in the radio-frequency plasma generation means 10 by a radio-frequency plasma, and is then further plasma-etching as far as the final step in, for example, the microwave plasma generation means 40 by a microwave plasma. During the plasma-etching of the sample 100 in the microwave plasma generation means 40, another sample is transported into the radio-frequency plasma generation means 10 where it is plasma-etched as far as the intermediate step, and then this sample is further plasma-etched as far as the final step in the second microwave plasma generation means 40'' by a microwave plasma. During the plasma-etching of the other sample in the second microwave plasma generation means 40'', a third sample is transported into the radio-frequency plasma generation means 10 where it is plasma-etched as far as the intermediate step, and is further plasma-etched as far as the final step in the microwave plasma generation means 40 by a microwave plasma.

By repeating these operations, samples etched as far as the intermediate step by the radio-frequency plasma can be subsequently plasma-etched in parallel as far as the final step by two microwave plasmas.

In addition to the effects obtained by the first embodiment, as described above, the additional effect obtained by the second embodiment can also be obtained.

As described above, the present invention provides a plasma process wherein samples are processed with a radio-frequency plasma and the samples so processed are then processed with a microwave plasma to a final stage by means of a plasma processing apparatus, which provides a radio-frequency plasma generation means for generating said radio-frequency plasma and for processing the samples with the radio-frequency plasma as well as a microwave plasma generation means for generating microwave plasma and for processing the samples with the microwave plasma, so that the samples can be etched with an increased self-bias as far as an intermediate step and with a reduced self-bias thereafter as far as the final step, the plasma processing rate can be increased, and electrical damage due to ions in the plasma can be reduced, thus enabling a high throughput and a high quality in the manufacture of semiconductor integrated circuit elements.

What is claimed is:

1. A plasma-processing method comprising a step of processing samples with a radio-frequency plasma, and another step of processing the radio-frequency plasma processed samples with a microwave plasma.

2. The plasma-processing method as defined in claim 1, wherein the step of processing samples with a radio-frequency plasma includes processing the samples with a radio-frequency plasma having a large self-bias, and the another step of processing the radio-frequency plasma process samples with a microwave plasma includes processing the radio-frequency plasma process samples with a microwave plasma having a small self-bias so as to enable an increase in the plasma processing rate of said samples and a reduction of electrical damage of said samples due to ions in the plasma.

3. The plasma-processing method as defined in claim 1, wherein said samples which have been processed by the utilization of said radio-frequency plasma are subjected to a plasma process as far as a final stage by the utilization of a plurality of said microwave plasmas.

4. The plasma-processing method as defined in claim 3, wherein said samples which have been processed by the utilization of said radio-frequency plasma are subjected to plasma processes in series as far as said final stage by the utilization of said plurality of microwave plasmas.

5. The plasma-processing method as defined in claim 3, wherein said samples which have been processed by the utilization of said radio-frequency plasma are subjected to plasma processes in parallel as far as said final stage by the utilization of said plurality of microwave plasmas.

6. A plasma-processing apparatus comprising a radio-frequency plasma generation means which generates a radio-frequency plasma for processing a sample with said radio-frequency plasma, and a microwave plasma generation means which generates a microwave plasma for processing said sample with said microwave plasma.

7. The plasma-processing apparatus as defined in claim 6, wherein said microwave plasma generation means is provided on a post-process side of said radio-frequency plasma generation means, through an auxiliary vacuum chamber.

8. The plasma-processing apparatus as defined in claim 7, wherein a plurality of sets of said microwave plasma generation means is provided on the post-process side of said radio-frequency plasma generation means, through said auxiliary vacuum chamber.

9. The plasma-processing apparatus as defined in claim 8, wherein said plurality of sets of said microwave plasma generation means is provided in series after said radio-frequency plasma generation means.

10. The plasma-processing apparatus as defined in claim 8, wherein said plurality of sets of said microwave plasma generation means is provided in parallel after said radio-frequency plasma generation means.

11. The plasma-processing apparatus as defined in claim 7, wherein said microwave plasma generation means is provided on the post-process side of said radio-frequency plasma generation means, and a transportation means is provided between said radio-frequency plasma generation means and said microwave plasma generation means for transporting said samples through said auxiliary vacuum chamber.

12. The plasma-processing apparatus as defined in claim 6, wherein said radio-frequency plasma generation means is disposed for initially processing a sample with said radio-frequency plasma, and said microwave plasma generation means is disposed for processing said radio-frequency plasma processed sample, said radio-frequency plasma generation means enabling processing of said samples with a radio-frequency plasma having a large self-bias, and said microwave plasma generation means enabling processing of said radio-frequency plasma processed samples with a microwave plasma having a small self-bias, thereby enabling an increase in the plasma processing rate and a reduction in electrical damage of the samples due to ions in the plasma.

* * * * *